United States Patent [19]

Banerjee et al.

[11] Patent Number: 5,296,045
[45] Date of Patent: Mar. 22, 1994

[54] COMPOSITE BACK REFLECTOR FOR PHOTOVOLTAIC DEVICE

[75] Inventors: Arindam Banerjee, Madison Heights; Chi C. Yang; Subhendu Guha, both of Troy, all of Mich.

[73] Assignee: United Solar Systems Corporation, Troy, Mich.

[21] Appl. No.: 941,157

[22] Filed: Sep. 4, 1992

[51] Int. Cl.$^5$ ............... H01L 31/06; H01L 31/075
[52] U.S. Cl. .................... 136/249; 136/256; 136/258; 136/259; 257/436
[58] Field of Search ......... 136/256, 258 AM, 258 PC, 136/259, 249 TJ; 257/436

[56] References Cited

U.S. PATENT DOCUMENTS

| | | | |
|---|---|---|---|
| 4,419,533 | 12/1983 | Czubatyj et al. | 136/259 |
| 4,514,583 | 4/1985 | Izu et al. | 136/259 |
| 4,663,495 | 5/1987 | Berman et al. | 136/248 |
| 5,101,260 | 3/1992 | Nath et al. | 257/53 |
| 5,221,854 | 6/1993 | Banerjee et al. | 257/431 |
| 5,230,746 | 7/1993 | Wiedeman et al. | 136/249 |
| 5,250,120 | 10/1993 | Takada et al. | 136/256 |

FOREIGN PATENT DOCUMENTS 3-99477  4/1991  Japan .................... 136/259

*Primary Examiner*—Aaron Weisstuch
*Attorney, Agent, or Firm*—Howard & Howard

[57] ABSTRACT

A back reflector for a photovoltaic device includes an electrically conductive, textured layer and a reflective layer conformally disposed on the textured layer. The reflector may include a protective layer atop the reflective layer. The materials of the reflector are selected to be non-reactive under conditions encountered in the manufacture and use of the photovoltaic device.

20 Claims, 1 Drawing Sheet

COMPOSITE BACK REFLECTOR FOR PHOTOVOLTAIC DEVICE

FIELD OF THE INVENTION

This invention relates generally to photovoltaic devices. More specifically, the invention relates to back reflectors for redirecting unabsorbed, incident light through the photoactive layer of a photovoltaic device for further absorption. Most specifically, the invention relates to a multi-layered back reflector for photovoltaic devices.

BACKGROUND OF THE INVENTION

Photovoltaic devices, particularly photovoltaic devices manufactured from deposited layers of thin film semiconductor material, preferably include a back reflector disposed beneath the photoactive semiconductor layers. The back reflector redirects light which has passed through the photovoltaic body unabsorbed, back through that body for further absorption. The use of a back reflector increases the efficiency of the photovoltaic device and permits the use of relatively thinner layers of photoactive material, thereby enhancing the collection efficiency of the device as well as producing a savings in materials. In many instances, the back reflectors are textured so as to provide a diffuse reflecting surface which increases the path length of the reflected light and also provides for enhanced internal reflection.

It is fundamental that a back reflector be highly reflective of light having a wavelength corresponding to the photo response spectrum of the semiconductor layers. In general, it has been found that metals such as aluminum, silver, and copper are good reflectors for thin film photovoltaic devices, such as silicon alloy devices. It is also most important that the materials comprising the back reflector not react with one another or with other materials in the photovoltaic device, either during its manufacture or its use. Such reactions can degrade the efficiency of the device or render it inoperative. Back reflector structures must also be mechanically compatible with the remaining layers of the photovoltaic device. The thinness of the layers can make the device sensitive to a number of mechanical defects. Spikes, or other protrusions in the substrate or in the back reflector can produce shunts or short circuits through the semiconductor layers, thereby compromising device function. Additionally, a back reflector structure which cracks, deforms or otherwise delaminates from the substrate can destroy superjacent semiconductor layers to the detriment of device function. Accordingly, it will be appreciated that back reflectors for thin film photovoltaic devices should be highly reflective of light, nonreactive with adjacent layers of the device, and mechanically compatible with device structure and processing.

The simplest prior art approach to provide a back reflector comprises depositing the various layers of the photovoltaic device upon a highly polished substrate, typically stainless steel. However, while stainless steel is mechanically stable and nonreactive, it is not very highly reflective of light; the integrated reflectivity of most stainless steels is only about 45%. Furthermore, providing a textured reflective surface to the stainless steel is somewhat difficult. As a consequence, more sophisticated back reflector structures have been developed. Aluminum, with or without a silicon alloying agent, is highly reflective of light and the texture of the layer may be controlled via the parameters of the deposition process. Aluminum is somewhat reactive and as a consequence, in most instances it is coated with a protective layer of a conductive material such as a metallic oxide which may optionally include an additional metal. In some instances, the aluminum is deposited as a specular; i.e., smooth, reflector and a textured protective layer is deposited thereatop to provide for light scattering. Back reflectors of this type are presently incorporated in a variety of photovoltaic devices and are disclosed, for example, in U.S. Pat. No. 5,101,260.

While aluminum is a good light reflector, silver and copper are better yet, particularly for those portions of the electromagnetic spectrum which correlate to the response spectrum of thin film silicon alloy materials; and as a consequence, it is highly desirable to include these metals in back reflective structures. Silver/zinc oxide back reflectors have been employed in the past and U.S. Pat. No. 4,816,082 describes a photovoltaic device having a back reflector of this type. Silver is a relatively soft metal and it has been found that while high efficiency photovoltaic devices can be manufactured with a silver/zinc oxide back reflector, significant problems of yield occur which limit the commercialization of this type of device. These problems are particularly severe when the silver layer is relatively thick, as for example when it is texturized, and it is speculated that the soft silver deforms during processing and use of the photovoltaic device thereby giving rise to a variety of failures. In an attempt to overcome this problem, a conventional aluminum silicon alloy back reflector was provided with a relatively thin layer of silver thereupon. This technology is described in the aforementioned U.S. Pat. No. 5,101,260. Again, it was found that while the silver enhanced the efficiency of the device somewhat, the efficiency was not as good as that attained using a thick silver/zinc oxide reflector. It is the speculation of the present inventors that reaction between the silver and aluminum layers during the manufacture and/or use of the device results in a lowered reflectivity of the metal which lowers the short circuit current density, and hence the efficiency, of the device.

The present invention, as will be described in greater detail hereinbelow, provides a highly reflective back reflector structure which may optionally be texturized. Photovoltaic devices including the back reflector of the present invention may be readily manufactured in high yield and exhibit high efficiency and stability in use. These and other advantages of the present invention will be readily apparent from the drawings, discussion and description which follow.

BRIEF DESCRIPTION OF THE INVENTION

There is disclosed herein a photovoltaic device comprising an electrically conductive substrate having a composite back reflector disposed thereupon. The back reflector includes an electrically conductive texturizing layer disposed atop the substrate and a light reflecting layer conformally disposed atop the texturizing layer. The texturizing layer and light reflecting layer are fabricated from materials which are mutually nonreactive, such terms being understood to mean that the materials do not react adversely during conditions encountered in the manufacture or use of the photovoltaic device. The device of the present invention further includes a body of photovoltaic material disposed atop the composite back reflector and a top electrode disposed atop the photovoltaic body.

In particular embodiments, the texturizing layer includes features formed thereupon having a size in excess of 0.3 micron. In another embodiment, the features of the texturizing layer range from 0.3 to 10 microns. The texturizing layer may comprise a layer of metal oxide such as zinc oxide and the reflecting layer may comprise a layer of metal such as silver, copper, and alloys thereof. The back reflector may further include a top protective layer which is also nonreactive with the reflective layer. The top protective layer may comprise a layer of metal oxide such as zinc oxide.

In a particular embodiment, the body of photovoltaic material includes a layer of silicon alloy material. In one embodiment the photovoltaic body includes at least one triad of layers of silicon alloy material, said triad comprising a layer of substantially intrinsic material interposed between two oppositely doped layers of alloy material. In another specific embodiment, the photovoltaic body includes two of such triads stacked together. In yet another embodiment, the composite back reflector includes a base layer interposed between the texturizing layer and substrate. The base layer may, in some instances, comprise a layer of aluminum alloyed with silicon.

DETAILED DESCRIPTION OF THE INVENTION

Figure 1:
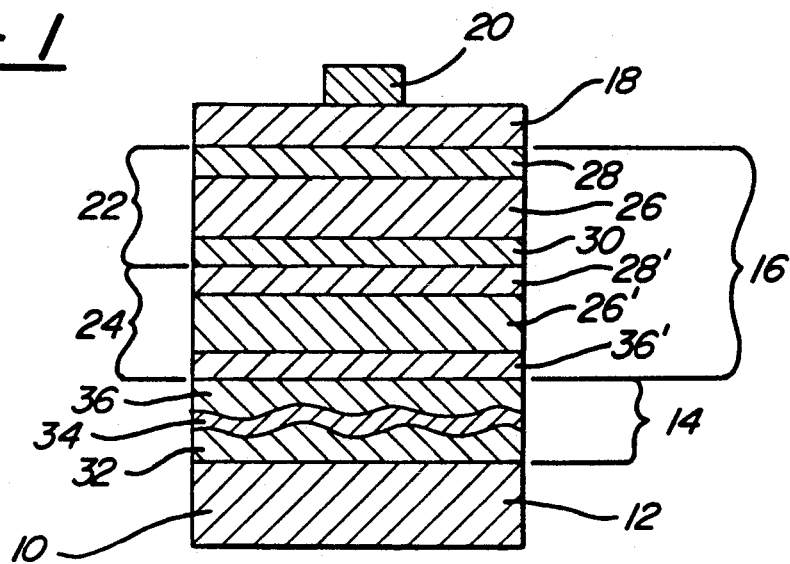
FIG. 1 is a cross-sectional view of a photovoltaic device structured in accord with the principles of the present invention.

Referring now to FIG. 1, there is shown a photovoltaic device 10 structured in accord with the present invention. The device 10 includes a substrate 12, a composite back reflector 14 disposed upon the substrate, a photovoltaic body 16 disposed upon the back reflector 14 and a layer of top electrode material 18 disposed atop the semiconductor body 16. In the illustrated embodiment, the photovoltaic device 10 includes a current collection grid 20 disposed upon the top electrode 18. In operation, incident light passes through the top electrode 18, which is preferably formed from a transparent, electrically conductive material such as a transparent conductive oxide (TCO) and passes into the photovoltaic body 16 for absorption thereby. Light which is not absorbed by the photovoltaic body 16 is reflected from the back reflector structure back therethrough for further absorption. The absorbed photons create electron-hole pairs in the photovoltaic body and because of the particular electrical characteristics of the various layers of the photovoltaic body 16, these charge carriers are separated and conveyed to the top electrode 18 and electrically conductive substrate electrode 12 for collection.

In one preferred embodiment, the substrate 12 is fabricated from stainless steel. Other substrate materials can include other types of steels as well as metals such as aluminum, copper, and the like, or the substrate may comprise an electrically insulating support, such as a polymeric support having a conductive material supported thereupon. The photovoltaic body 16, in this embodiment comprises two separate triads 22,24 of layers of photovoltaic material. Each triad includes a layer of substantially intrinsic semiconductor alloy material 26,26' interposed between oppositely doped semiconductor layers. In the illustrated embodiment the intrinsic layer 26 of the first triad 22 is interposed between a P doped 28, and N doped 30, layer and the intrinsic body 26' of the second triad 24 is interposed between a layer of P doped material 28', and a layer of N doped material 30'. One particularly preferred semiconductor material comprises a thin film alloy of silicon with hydrogen and possibly halogens. Other materials comprise thin film alloys of germanium as well as silicon-germanium alloys. In the illustrated embodiment, the layers of P doped material 28,28' are preferably layers of microcrystalline material whereas the intrinsic 26,26' and N doped 30,30' layers are substantially amorphous. It is to be understood that the reflector of the present invention may be adapted to a variety of photovoltaic devices.

The back reflector 14 of the FIG. 1 embodiment is a multilayered structure comprising a texturizing layer 32 disposed adjacent the substrate 12. The texturizing layer 32 includes features formed thereupon and it is generally preferred that these features are in the size range of 0.3-10 microns. Disposed immediately atop the texturizing layer 32 is a reflective layer 34 which is conformal with the texturizing layer 32. In the context of this disclosure, a reflective layer is described as being conformal with the texturizing layer 34 to indicate that it generally follows the configuration of the texturizing layer 32 and reproduces, at least to some degree, its features upon its upper surface. It will be appreciated that in this manner, there is provided a reflective layer 34 which includes light directing features thereupon. The back reflector 14 of the FIG. 1 embodiment further includes a top protective layer 36 disposed upon the reflective layer 34. As illustrated, the protective layer 36 conforms to the top surface of the reflective layer 34 and itself includes a relatively flat top surface. It is to be understood that the top protective layer may also include some degree of texture itself, either corresponding to, or independent of, the texture of the other layers. In accord with the principles of the present invention, the texturizing layer 32, reflective layer 34, and protective layer 36 (if present) are made from materials which are non-reactive at temperatures encountered in the manufacture and use of the photovoltaic devices. This temperature range will generally include those temperatures below 600° C., and more typically, temperatures in the range of −20° to 450° C.

It is generally preferred that the back reflector 14 have a fairly high electrical conductivity so as to not unduly increase the series resistance of the photovoltaic device. Toward that end, the reflective layer 34 is preferably a layer of metallic material such as silver or copper. The texturizing layer 32 and protective layer 36 are fabricated from an electrically conductive material. Transparent conductive oxides are one particularly preferred material for the texturizing and protective layer. As is known in the art these materials comprise highly degenerate semiconductors which combine reasonable electrical conductivity with optical transparency. Illustrative of some TCO's are: indium oxide, tin oxide, zinc oxide, cadmium stannate and various combinations thereof.

Figure 2:
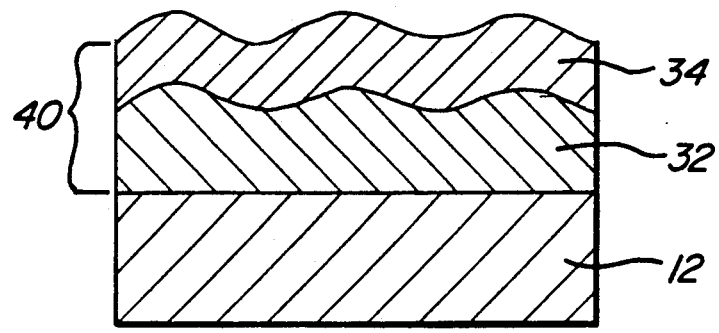
FIG. 2 is a cross-sectional view of a composite back reflector, structured in accord with the present invention, and disposed upon a substrate.

Referring now to FIG. 2, there is shown another embodiment of a back reflector 40 structured in accord with the principles of the present invention. The back reflector 40 is disposed upon a substrate 12 and specifically includes a texturizing layer 32 disposed immediately atop the substrate 12. The back reflector 40 further includes a reflective layer 34 in a conformal relationship with the texturizing layer 32. As noted above, the reflective layer 34 may be fabricated from any highly reflective material such as silver or copper as well as alloys of those materials. Sterling silver is an alloy of silver and copper and is one particularly preferred alloy. The texturizing layer 32 need not be transparent. The prime criteria are that the texturizing layer 32 be electrically conductive and nonreactive with the reflecting layer 34. As noted above, transparent conductive oxides comprise one preferred class of materials for the texturizing layer. These materials may be deposited by sputtering, evaporation, or reactive pyrolysis techniques to include surface textures in the range of 0.3 to 10 microns.

Figure 3:
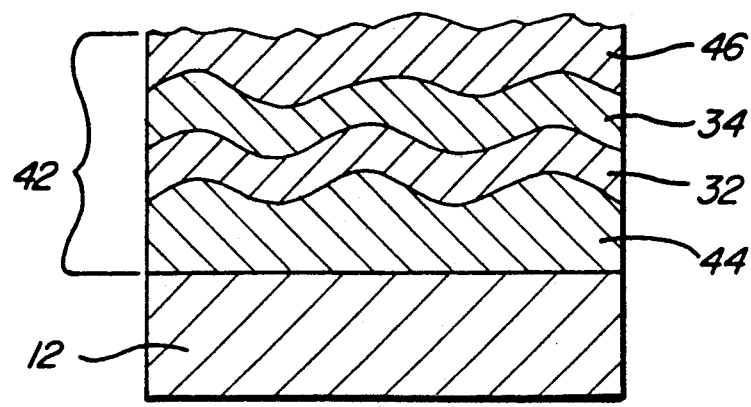
FIG. 3 is a cross-sectional view of another composite back reflector of the present invention as disposed upon a substrate.

Referring now to FIG. 3, there is shown yet another back reflector 42 disposed upon a substrate 12. The back reflector 42 of FIG. 3 includes a reflective layer 34 and a texturizing layer 32 as generally described hereinabove, but further includes a base layer 44 interposed between the texturizing layer 32 and substrate 12. The base layer 44 is shown as a textured layer and as such imparts its own texture to the texturizing layer 32 which is conformed therewith. It is to be understood that the base layer 44 need not be textured but may simply comprise a relatively smooth layer of material having the texturizing layer 32 disposed thereupon. In one particularly preferred embodiment, the base layer 44 comprises an aluminum-silicon alloy material and this layer may be textured. The back reflector 42 of the FIG. 3 embodiment further includes a top protective layer 46 which is generally similar to the top protective layer 36 described with reference to FIG. 1. The top protective layer 46, in this embodiment, as shown as being slightly textured; although it is to be understood that the top protective layer 46 may be smooth or fully textured.

EXPERIMENTAL

In order to illustrate the principles of the present invention, a series of photovoltaic devices were prepared, with each device including a different back reflector structure. The efficiency of the devices was determined by measuring the short circuit current generated under global AM 1.5 illumination; the production yield of the devices was also measured. The data is summarized in the table hereinbelow.

Each device comprised a single P-I-N type photovoltaic device disposed upon the listed back reflector structure, which was in turn supported upon a stainless steel substrate. Each device included a layer of n-doped silicon alloy material of approximately 200 angstroms thickness, a superposed layer of intrinsic silicon alloy material of approximately 4000 angstroms thickness, a layer of microcrystalline, p-doped silicon alloy material of approximately 100 angstroms thickness disposed atop the intrinsic layer and an upper electrode of a transparent conductive oxide material of approximately 650 angstroms thickness.

The cells were each prepared upon a stainless steel bottom electrode which was previously provided with the appropriate back reflector structure, as will be detailed hereinbelow. The semiconductor layers were deposited by radio frequency energized glow discharge deposition, in accord with procedures well known to those of skill in the art. Each substrate was placed in the deposition region of a radio frequency energized deposition apparatus; the apparatus was sealed and an atmosphere comprising 20 sccm of hydrogen, 0.75 sccm of a 1% mixture of phosphine in hydrogen and 0.65 sccm of disilane was flowed through the deposition apparatus. A vacuum pump associated with the apparatus was adjusted to maintain a pressure of 1.2 torr in the deposition chamber. The substrate was heated to a temperature of approximately 350° C. and two watts of radio frequency energy of 13.56 MHz was applied to a cathode which was approximately 3.5 inches in diameter. Deposition conditions were maintained for approximately 75 seconds so as to deposit a 200 angstrom thick layer of n-doped silicon alloy material onto the substrate. In the next step of the deposition, the intrinsic layer was deposited atop the n-doped layer. Toward that end, the flow of phosphine gas was terminated while the flows of hydrogen and disilane were continued as noted hereinabove. The substrate was maintained at a temperature of 275° C. and the cathode again energized with two watts of radio frequency energy. The cathode was energized for approximately 25 minutes so as to deposit a 4000 angstroms thick layer of intrinsic silicon alloy material. A p-doped layer was deposited atop the intrinsic layer as follows: an atmosphere of 95 sccm of hydrogen, 3.25 sccm of a 2% mixture of $BF_3$ in hydrogen and 2.5 sccm of a 5% mixture of silane in hydrogen was flowed through the chamber at a pressure of 1.7 torr. The cathode was energized as before and deposition conditions maintained for 65 seconds so as to deposit a 100 angstrom thick layer of microcrystalline, p-doped silicon alloy material.

The thus-produced devices were removed from the chamber and a top electrode of approximately 650 angstroms of indium tin oxide was applied thereto by a conventional vacuum evaporation process. The devices were then tested under global AM1.5 illumination in a solar simulator. The short circuit current was measured and device yield was assessed subjectively by determining the number of poor quality devices produced in a series of repeat runs.

| Sample | Reflector Structure | $J_{sc}$ (ma/cm$^2$) | Yield |
| --- | --- | --- | --- |
| 1 | T-Ag/ZnO | 16.85 | Poor |
| 2 | T-ZnO/S-Ag/ZnO | 16.71 | Good |
| 3 | T-Al Si/ZnO/S-Ag/ZnO | 16.90 | Good |
| 4 | T-Al Si/S-Ag(−)/ZnO | 15.15 | Good |
| 5 | T-Al Si/S-Ag(+)/ZnO | 15.55 | Medium |
| 6 | T-Al Si/ZnO/S-Ag(+)/ZnO | 16.44 | Poor |

Sample 1 included a back reflector structure comprising a relatively thick layer of textured silver having a layer of zinc oxide disposed thereupon. The silver layer was prepared by sputtering and was approximately 3000 angstroms thick. The zinc oxide was also prepared by sputtering and was 5000 angstroms thick. The short circuit current of this device was 16.85 ma/cm$^2$. The yield in production of devices of this type is quite poor and, as noted hereinabove, it is speculated that the relatively soft, thick silver deforms during processing and handling.

Sample 2 includes a back reflector comprised of a textured layer of zinc oxide of approximately 5000 angstroms thickness having a specular (i.e., smooth) layer of silver of approximately 2000 angstroms thickness deposited conformally thereupon and a layer of zinc oxide of approximately 5000 angstroms thickness atop the silver. The short circuit current of this device was 16.71 ma/cm² and production yield was good.

Sample 3 included a back reflector comprised of a textured layer of an aluminum silicon alloy of approximately 5000 angstroms thickness, a layer of zinc oxide of approximately 1000 angstroms thickness conformally disposed thereupon, a layer of specular silver of approximately 2000 angstroms thickness disposed atop the first zinc oxide layer and a second layer of zinc oxide of approximately 5000 angstroms thickness disposed atop silver. This structure corresponds generally to that illustrated in FIG. 3. The short circuit current of this device was measured at 16.90 ma/cm² and the production yield was good.

The fourth experimental device included a back reflector comprised of a textured layer of aluminum silicon alloy of approximately 5000 angstroms thickness, a relatively thin layer of specular silver of approximately 1000 angstroms thickness disposed upon the aluminum-silicon alloy and a 5000 angstrom thick layer of zinc oxide atop the silver. This device manifested a good production yield; however, short circuit current was measured at 15.15 ma/cm². As noted hereinabove, it is speculated that the silver alloyed, or otherwise reacted with the aluminum silicon layer thereby lowering its reflectivity, and hence the current produced by the cell.

The back reflector of sample 5 was similar to that of sample 4 except that the silver layer was approximately 4000 angstroms thick. This thicker silver layer was not degraded as greatly in reflectivity by interaction with the aluminum silicon layer and hence short circuit current rose to 15.55 ma/cm². It is notable that the yield decreased somewhat, and this fact is postulated to be attributable to possible deformation of the thicker layer of silver during processing and handling.

The back reflector of sample 6 is generally similar to that of example 3; however, the silver layer is approximately 4000 angstroms thick. The thicker layer again correlates with reduced yields.

It will thus be seen from the foregoing the efficiency and yield of photovoltaic devices are both increased when the device includes a back reflector in which a layer of reflective material is conformally disposed upon a texturizing layer and in which the texturizing layer and reflective layer are virtually non-reactive. It is further seen that relatively thick layers of soft material such as silver are to be avoided if yield is to be maintained.

The foregoing is really meant to illustrate particular features of the present invention. It is not meant to be a limitation upon the practice thereof. While the examples describe the use of silver/zinc oxide reflector structures, it will be appreciated that other metals such as copper are highly reflective of light, particularly in the response region of typical photovoltaic devices and may be similarly employed. Likewise, texturizing and protective layers of other non-reactive material such as transparent conductive oxides, metals and the like may be similarly employed. It is the following claims which define the scope of the invention.

We claim:
1. A photovoltaic device comprising:
an electrically conductive substrate;
a composite back reflector disposed on said substrate, said reflector including an electrically conducting, texturizing layer disposed atop said substrate and a light reflecting layer conformally disposed atop said texturizing layer, said texturizing layer and light reflecting layer being fabricated from materials which are mutually non-reactive over a temperature range of −20° C. to 450° C.;
a body of photovoltaic material disposed atop the composite back reflector; and
a top electrode disposed atop the photovoltaic body.

2. A photovoltaic device as in claim 1, wherein said texturizing layer includes surface features in excess of 0.3 micron in size.

3. A photovoltaic device as in claim 1, wherein said texturizing layer includes features in the size range of 0.3 to 10 microns.

4. A photovoltaic device as in claim 1, wherein said texturizing layer is fabricated from a metallic oxide.

5. A photovoltaic device as in claim 1, wherein said texturizing layer is a layer of zinc oxide.

6. A photovoltaic device as in claim 1, wherein said light reflecting layer is a layer of metal.

7. A photovoltaic device as in claim 6, wherein said metal is selected from the group consisting of silver, copper, and combinations thereof.

8. A photovoltaic device as in claim 1, wherein said composite back reflector further includes a top protective layer disposed atop the light reflecting layer, said top reflective layer being electrically conductive and non reactive with the reflecting layer.

9. A photovoltaic device as in claim 8, wherein said top protective layer is a layer of zinc oxide.

10. A photovoltaic device as in claim 1, wherein said composite back reflector further includes an electrically conductive base layer interposed between the substrate and the texturizing layer.

11. A photovoltaic device as in claim 10, wherein said base layer is a layer of an aluminum-silicon alloy.

12. A photovoltaic device as in claim 10, wherein said base layer is textured and said texturing layer is conformal therewith.

13. A photovoltaic device as in claim 1, wherein said body of photovoltaic material is a multi-layered body including at least one layer of a silicon alloy material.

14. A photovoltaic device as in claim 13, wherein said photovoltaic body includes at least one triad comprised of a body of intrinsic semiconductor material interposed between oppositely doped layers of semiconductor material.

15. A photovoltaic device as in claim 14 wherein said body of photovoltaic material comprises two of said triads in a superposed relationship.

16. In a photovoltaic device of the type comprising an electrically conductive substrate electrode; a top, light-transmissive electrode and a body of photovoltaic semiconductor material interposed between said electrodes, wherein the improvement comprises:
a composite back reflector interposed between said substrate electrode and body of photovoltaic material, said back reflector operative to redirect light which has passed through the top electrode and semiconductor body back through the semiconductor body, said composite reflector including: an electrically conductive, texturizing layer of a metallic oxide material disposed proximate the substrate electrode, a metallic, light reflecting layer conformally disposed atop the texturizing layer, and a transparent, electrically conductive top protective layer disposed atop the metallic layer, said texturizing layer and top protective layer being fabricated from materials which are nonreactive with the metallic layer at temperatures encountered during the manufacture and use of the photovoltaic device.

17. A photovoltaic device as in claim 16, wherein said texturizing layer and said top protective layer are layers of zinc oxide and the light reflective layer is fabricated from a material selected from the group consisting of silver, copper, and combinations thereof.

18. A photovoltaic device as in claim 16, wherein said back reflector further includes an electrically conductive base layer interposed between the texturizing layer and the substrate.

19. A photovoltaic device as in claim 18, wherein said base layer is a layer of an aluminum-silicon alloy.

20. A photovoltaic device as in claim 18, wherein said base layer is textured and the texturizing layer is conformal therewith.

* * * * *